(12) United States Patent
Sim et al.

(10) Patent No.: US 11,958,874 B2
(45) Date of Patent: Apr. 16, 2024

(54) ORGANO TIN COMPOUND FOR THIN FILM DEPOSITION AND METHOD FOR FORMING TIN-CONTAINING THIN FILM USING SAME

(71) Applicants: EGTM Co., Ltd., Suwon-Si (KR); SK hynix Inc., Icheon-Si (KR)

(72) Inventors: Jang Keun Sim, Suwon-Si (KR); Sung Jun Ji, Suwon-Si (KR); Tae Young Lee, Suwon-Si (KR); Shin Beom Kim, Seongnam-Si (KR); Sun Young Baik, Incheon (KR); Tae Hwan Lim, Icheon-Si (KR); Dong Kyun Lee, Icheon-Si (KR); Sang Hyun Lee, Icheon-Si (KR); Su Pill Chun, Icheon-Si (KR)

(73) Assignees: EGTM Co., Ltd., Suwon-Si (KR); SK hynix Inc., Icheon-Si (KR)

( * ) Notice: Subject to any disclaimer, the term of this patent is extended or adjusted under 35 U.S.C. 154(b) by 0 days.

(21) Appl. No.: 17/717,612

(22) Filed: Apr. 11, 2022

(65) Prior Publication Data
US 2022/0402946 A1 Dec. 22, 2022

(30) Foreign Application Priority Data
Jun. 17, 2021 (KR) .................. 10-2021-0078817

(51) Int. Cl.
*C07F 7/22* (2006.01)
*B05D 1/00* (2006.01)
*C23C 16/448* (2006.01)
*C23C 16/455* (2006.01)

(52) U.S. Cl.
CPC ............. *C07F 7/2284* (2013.01); *B05D 1/60* (2013.01); *C23C 16/4481* (2013.01); *C23C 16/45553* (2013.01)

(58) Field of Classification Search
CPC .......................... C07F 7/2284; C07F 7/2224
See application file for complete search history.

(56) References Cited

U.S. PATENT DOCUMENTS

| | | | | |
|---|---|---|---|---|
| 11,685,752 B2 * | 6/2023 | Ermert | .................. | C07F 7/2296 556/87 |
| 2018/0155372 A1* | 6/2018 | Ryu | .................. | C23C 16/45553 |
| 2023/0095666 A1* | 3/2023 | Arkles | .................... | G03F 7/167 427/255.39 |

FOREIGN PATENT DOCUMENTS

| | | | |
|---|---|---|---|
| DE | 247006 A | * | 6/1987 |
| JP | 2021-025121 A | | 2/2021 |
| KR | 10-2009-0100583 A | | 9/2009 |
| KR | 10-2012-0125102 A | | 11/2012 |
| KR | 10-2017-0055274 A | | 5/2017 |
| KR | 10-2018-0063754 A | | 6/2018 |

OTHER PUBLICATIONS

CAS Abstract and Indexed Compounds, S. Mel'nichenko et al., 200 Doklady Akademii Nauk SSSR, 346-347 (1971) (Year: 1971).*
CAS Abstract and Indexed Compounds, A. Tzachach et al., DD 247006 (1987) (Year: 1987).*
R. Visalakshi et al., 28A Indian Journal of Chemistry, 767-770 (1989) (Year: 1989).*
CAS Abstract and Indexed Compound, R. Visalakshi et al., 28A Indian Journal of Chemistry, 767-770 (1989) (Year: 1989).*
S. Mel'nichenko et al., 200 Doklady Akademii Nauk SSSR, 346-347 (1971) (Year: 1971).*
Mel'nichenko, L. S. et al. "Synthesis and some properties of organotin compounds of the R(C6H5)SnX2 class". The Chemical Abstract and the Accession No. 76:14664 CA. Entered STN: May 12, 1984.
Tzschach, Alfred et al. "Preparation of diorganostannyldiamides as biocide intermediates". The Chemical Abstract and the Accession No. 108:94783 CA. Entered STN: Mar. 19, 1988.
Office Action dated May 29, 2023 from Korean Intellectual Property Office for Korean Patent Application No. 10-2021-0078817; 6 pages.
Machine Translation of Office Action dated May 29, 2023 from Korean Intellectual Property Office for Korean Patent Application No. 10-2021-0078817; 6 pages.
Notice of Allowance dated Dec. 19, 2023 from Korean Intellectual Property Office for Korean Patent Application No. 10-2021-0078817; 3 pages.
Machine Translation of the Notice of Allowance dated Dec. 19, 2023 from Korean Intellectual Property Office for Korean Patent Application No. 10-2021-0078817; 3 pages.

* cited by examiner

*Primary Examiner* — Alexander R Pagano (57) ABSTRACT

According to the embodiment of the present disclosure, an organo tin compound is represented by the following Chemical Formula 1:

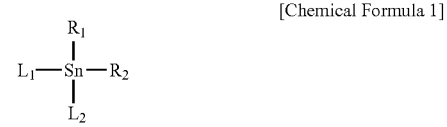

[Chemical Formula 1]

In Chemical Formula 1,
$L_1$ and $L_2$ are each independently selected from an alkoxy group having 1 to 10 carbon atoms and an alkylamino group having 1 to 10 carbon atoms,
$R_1$ is a substituted or unsubstituted aryl group having 6 to 8 carbon atoms, and
$R_2$ is selected from a substituted or unsubstituted linear alkyl group having 1 to 4 carbon atoms, a branched alkyl group having 3 to 4 carbon atoms, a cycloalkyl group having 3 to 6 carbon atoms, and an allyl group having 2 to 4 carbon atoms.

9 Claims, 5 Drawing Sheets

ORGANO TIN COMPOUND FOR THIN FILM DEPOSITION AND METHOD FOR FORMING TIN-CONTAINING THIN FILM USING SAME

CROSS-REFERENCE TO RELATED APPLICATIONS

This application claims the priority of Korean Patent Application No. 10-2021-0078817 filed on Jun. 17, 2021, in the Korean Intellectual Property Office, the disclosure of which is incorporated herein by reference.

BACKGROUND

Field

The present disclosure relates to an organo tin compound and a method for forming a tin-containing thin film using the same, and more particularly, to an organo tin compound used as a precursor for thin film deposition and a method for forming a tin-containing thin film using the same.

Description of the Related Art

The miniaturization and weight reduction of electronic elements used in various electronic devices are rapidly progressing due to the development of electronic technology, and semiconductor elements to be embedded are also required to have high operating speed, low driving voltage, and the like according to high speed and low power consumption of the electronic elements. In corresponding to these demands, various lithography processes capable of forming microcircuits have been developed in order to produce nanoscale semiconductor elements for next-generation semiconductor devices.

For example, since the extreme ultraviolet (EUV) lithography process uses extreme ultraviolet rays with a wavelength of 13.5 nm as a light source, extremely fine circuits can be easily implemented on a wafer with a limited area so that it is in the spotlight as a next-generation lithography process for semiconductor devices.

Meanwhile, in order to manufacture a microelectronic element, a metal thin film, a metal oxide thin film, a metal nitride thin film, or the like is formed by various physical and chemical vapor deposition methods. In general, a thin film containing a metal is formed using a metal organic chemical vapor deposition (MOCVD) process or an atomic layer deposition (ALD) process. Compared to the MOCVD process, since the ALD process is subjected to a self-limiting reaction so that it has excellent step coverage, and since it is a relatively low-temperature process, deterioration of element properties due to thermal diffusion can be avoided.

As described above, the thin film is formed by depositing a metal precursor material, and it should meet various physical properties such as appropriate and robust thermal stability, high reactivity, vapor pressure, long-term stability, etc. in order to easily manufacture a microelectronic element. However, development of a suitable metal precursor capable of forming a thin film of uniform thickness in a miniaturized three-dimensional structure, and the thin film is still insufficient.

SUMMARY

An object of the present disclosure is to provide an organo tin compound that is suitable for thin film growth, has robust thermal stability, exists in a liquid state at room temperature while having a high vapor pressure so that it is easy to store and handle. Another object of the present disclosure is to provide a precursor composition for thin film deposition capable of providing excellent physical properties using the organo tin compound. Another object of the present disclosure is to provide a thin film forming method for depositing a good quality thin film using the precursor composition for thin film deposition.

Other objects of the present disclosure will become more apparent from the following detailed description.

An organo tin compound according to an embodiment of the present disclosure may be represented by Chemical Formula 1.

[Chemical Formula 1]

In Chemical Formula 1, $L_1$ and $L_2$ are each independently selected from an alkoxy group having 1 to 10 carbon atoms and an alkylamino group having 1 to 10 carbon atoms, $R_1$ is a substituted or unsubstituted aryl group having 6 to 8 carbon atoms, and $R_2$ is selected from a substituted or unsubstituted linear alkyl group having 1 to 4 carbon atoms, a branched alkyl group having 3 to 4 carbon atoms, a cycloalkyl group having 3 to 6 carbon atoms, and an allyl group having 2 to 4 carbon atoms. For example, $L_1$ and $L_2$ may each be $-N(R_{11})(R_{12})$, and $R_{11}$ and $R_{12}$ may each be a linear alkyl group having 1 to 3 carbon atoms.

The present disclosure provides a precursor composition for depositing a tin-containing thin film, and the precursor composition for depositing a tin-containing thin film according to an embodiment of the present disclosure comprises the organo tin compound represented by Chemical Formula 1 above.

The method for forming a tin-containing thin film according to an embodiment of the present disclosure comprises depositing a thin film on the substrate through a metal organic chemical vapor deposition (MOCVD) process or an atomic layer deposition method (ALD) process by using the organo tin compound represented by Chemical Formula 1 above as a precursor.

The organo tin compound according to an embodiment of the present disclosure has excellent thermal stability, is easy to store and handle by existing in a liquid state at room temperature, and it has the advantage of being advantageous for application to a thin film formation process due to its high volatility. Further, the organo tin compound according to the present disclosure has excellent reactivity so that a good-quality tin thin film can be formed at a fast growth rate when forming a thin film. Further, the organo tin compound according to the present disclosure can effectively reduce the amount of residue in the deposition process, and can form a tin thin film having a uniform thickness.

Accordingly, a good-quality tin thin film can be stably formed on a substrate through an atomic layer deposition process or a metal organic chemical vapor deposition process using a composition comprising the organo tin compound according to the present disclosure as a precursor.

Due to the above effects of the invention, the organo tin compound according to the present disclosure is used as a precursor to enable a thin film with a uniform thickness to be formed on the surface of a miniaturized three-dimensional structure, and can further contribute to the fabrication of nanoscale semiconductor elements.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Advantages and features of the present disclosure and methods of achieving them will become apparent with reference to the embodiments to be described later in detail in conjunction with the accompanying drawings. However, the present disclosure is not limited to the embodiments disclosed below, but will be implemented in a variety of different shapes, only the present embodiments are provided so that the disclosure of the present disclosure is complete, and to completely inform those of ordinary skill in the art to which the present disclosure pertains of the scope of the invention, and the present disclosure is only defined by the scope of the claims.

In describing the present disclosure, if it is determined that a detailed description of a related known technology may unnecessarily obscure the gist of the present disclosure, the detailed description thereof will be omitted. When 'including', 'having', 'consisting', etc. mentioned in the present disclosure are used, other parts may be added unless 'only' is used. When a component is expressed in the singular number, cases including the plural number are included unless otherwise explicitly stated.

In interpreting the components, it is interpreted as including an error range even if there is no separate explicit description.

Throughout the present specification, the term "room temperature" means a temperature of 15 to 30° C.

Throughout the present specification, the term "unsubstitution" means having no substituent, or having a hydrogen atom substituted with one selected from light hydrogen, deuterium, and tritium that are isotopes.

Throughout the present specification, the term "substitution" means that a hydrogen atom or some atomic groups of the original compound are substituted with a substituent. For example, the substituent may be selected from an alkyl group having 1 to 10 carbon atoms, an alkenyl group having 2 to 12 carbon atoms, an alkynyl group having 2 to 12 carbon atoms, an alkynyl group having 3 to 12 carbon atoms, a cycloalkyl group having 3 to 12 carbon atoms, a heterocycloalkyl group having 2 to 12 carbon atoms, an aryl group having 6 to 20 carbon atoms, an alkoxy group having 1 to 12 carbon atoms, an alkylamino group having 1 to 12 carbon atoms, an alkyl halide group having 1 to 12 carbon atoms, a cyano group, a halogen group, a carboxy group, a hydroxy group, a carbonyl group, an amine group, a nitro group, and combinations thereof, but is not limited thereto.

Throughout the present specification, the term "alkyl group" includes a linear alkyl group having 1 to 6 carbon atoms and a branched alkyl group having 3 to 6 carbon atoms. For example, the alkyl group may include a methyl group, an ethyl group, an n-propyl group (n-Pr), an iso-propyl group (i-Pr), an n-butyl group (n-Bu), a tert-butyl group (t-Bu), an iso-butyl group (i-Bu), a sec-butyl group (s-Bu), an n-pentyl group, a tert-pentyl group, an iso-pentyl group, a sec-pentyl group, a neopentyl group, a 3-pentyl group, a hexyl group, an isohexyl group, and isomers thereof, but is not limited thereto.

Throughout the present specification, the term "alkoxy group" is a monovalent organic group represented by the general formula $R_aO$—, where $R_a$ may be an alkyl group having 1 to 10 carbon atoms or a branched alkyl group having 3 to 10 carbon atoms, but is not limited thereto.

Throughout the present specification, the term "alkylamino group" refers to a monovalent amino group substituted with an alkyl group.

Throughout the present specification, the term "aryl group" refers to a monovalent organic group derived from an aromatic hydrocarbon.

Throughout the present specification, the term "allyl group" refers to a monovalent organic group derived from a linear or branched unsaturated hydrocarbon having 2 or more carbon atoms having one or more C=C bonds.

The organo tin compound according to an exemplary embodiment of the present disclosure may be represented by Chemical Formula 1 below.

[Chemical Formula 1]

$L_1$ and $L_2$ are each independently selected from an alkoxy group having 1 to 10 carbon atoms and an alkylamino group having 1 to 10 carbon atoms, $R_1$ is a substituted or unsubstituted aryl group having 6 to 8 carbon atoms, $R_2$ is selected from a substituted or unsubstituted linear alkyl group having 1 to 4 carbon atoms, a branched alkyl group having 3 to 4 carbon atoms, a cycloalkyl group having 3 to 6 carbon atoms, and an allyl group having 2 to 4 carbon atoms.

Further, $L_1$ and $L_2$ in Chemical Formula 1 may each independently be one selected from —N($R_{11}$)($R_{12}$) and —O$R_{13}$.

Further, when $L_1$ and $L_2$ are —N($R_{11}$)($R_{12}$), $R_{11}$ and $R_{12}$ may each independently be a linear alkyl group having 1 to 6 carbon atoms or a branched alkyl group having 3 to 6 carbon atoms.

Further, when $L_1$ and $L_2$ are —O$R_{13}$, $R_{13}$ may be a linear alkyl group having 1 to 6 carbon atoms or a branched alkyl group having 3 to 6 carbon atoms.

Further, $L_1$ and $L_2$ in Chemical Formula 1 may be the same as or different from each other. For example, $L_1$ and $L_2$ in Chemical Formula 1 may each be —N($R_{11}$)($R_{12}$). At this time, $R_{11}$ and $R_{12}$ may also be the same as or different from each other, and for example, $R_{11}$ and $R_{12}$ may each be a linear alkyl group having 1 to 6 carbon atoms.

More specifically, the organo tin compound represented by Chemical Formula 1 may be a compound represented by Chemical Formula 2 below.

[Chemical Formula 2]

As another example, the organo tin compound represented by Chemical Formula 1 may be a compound represented by Chemical Formula 3 below.

[Chemical Formula 3]

The organo tin compound according to an embodiment of the present disclosure can maintain a more structurally stable state, and thus has excellent thermal stability. More specifically, the abundant electrons present in the aryl group contribute to the central metal so that the organo tin compound can become thermally stable. Accordingly, the organo tin compound according to an embodiment of the present disclosure may be used as a precursor composition for depositing a tin-containing thin film. Therefore, a tin thin film of good quality may be stably formed through an atomic layer deposition process or a metal organic chemical vapor deposition process using the organo tin compound according to an embodiment of the present disclosure as a precursor.

Further, the organo tin compound according to an embodiment of the present disclosure is easy to store and handle by existing in a liquid state at room temperature, and has the advantage of being advantageous for application to a thin film formation process due to its high volatility. When a thin film is formed through the deposition process, a precursor material should be easily transferred to the reaction chamber without being decomposed. Since the organo tin compound according to an embodiment of the present disclosure is thermally stable not to be decomposed, exists in a liquid state at room temperature, and has a high vapor pressure, it can be advantageously used in a process of depositing a thin film.

Further, the organo tin compound according to an embodiment of the present disclosure has excellent reactivity. Accordingly, when forming a thin film, it is grown at a high speed to enable a high-quality tin-containing thin film to be formed.

Further, the organo tin compound of Chemical Formula 1 according to an embodiment of the present disclosure can effectively reduce the amount of residues generated in the deposition process.

Furthermore, a thin film having a uniform thickness may be easily formed on the surface of a miniaturized three-dimensional structure by using the organo tin compound according to an embodiment of the present disclosure as a precursor.

Hereinafter, the organo tin compound according to the present disclosure will be described in more detail through the following Examples. However, this is only presented to help the understanding of the present disclosure, and the present disclosure is not limited to the following Examples.

Example 1: Preparation of Sn(t-Bu) (Phenyl) [$N(CH_3)_2$]2

14 g (0.045 mol) of Sn(t-Bu) [$N(CH_3)_2$]$_3$ and 100 ml of diethyl ether were put into a 500 ml flask and mixed. After slowly adding 15.91 ml (0.047 mol) of phenyl magnesium chloride in THF at about −70° C., the temperature was raised to room temperature, and the mixture was reacted while performing stirring for 8 hours. After performing filtration and pressure reduction on the reaction product to remove a solvent and by-products, 6 g of Sn(t-Bu) (phenyl) [$N(CH_3)_2$]$_2$ represented by Chemical Formula 2 was obtained at a yield of 38% by performing purification under conditions of a temperature of 90° C. and a pressure of 0.2 Torr.

Figure 1:
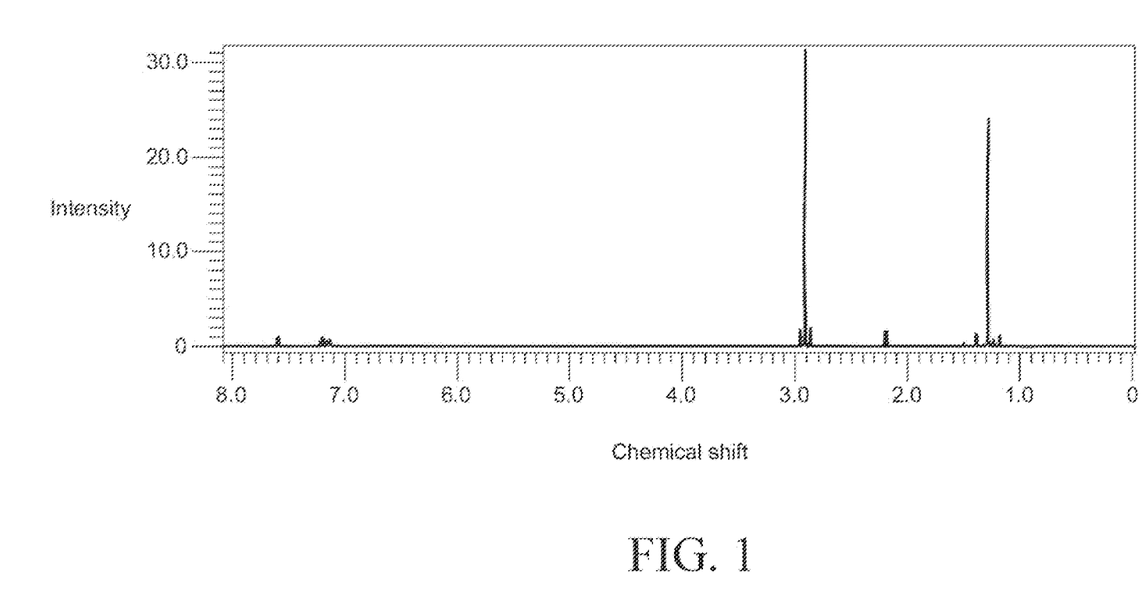
FIG. 1 is a graph showing the results of nuclear magnetic resonance analysis ($^1$H NMR) of the compound according to Example 1.

In order to confirm the synthesis of the compound, nuclear magnetic resonance analysis ($^1$H NMR) using $C_6D_6$ as a solvent was performed, and the results according thereto were attached to FIG. 1. Synthesis of the compound Sn(t-Bu) (Phenyl) [$N(CH_3)_2$]$_2$ was confirmed based on the results of nuclear magnetic resonance analysis shown in FIG. 1.

Comparative Example 1: Preparation of Sn(t-Bu) [$N(CH_3)_2$]$_3$ 188.27 ml (0.466 mol) of an n-butyllithium in hexane solution and 300 ml of n-hexane were put into a 1,000 ml flask and mixed. After slowly adding 21.8 g (0.483 mol) of dimethylamine at about −50° C., the temperature was raised to room temperature, and then the mixture was reacted while performing stirring for 5 hours. After slowly injecting 30.0 g (0.115 mol) of $SnCl_4$ at about −30° C., the temperature was raised to room temperature, and then the mixture was reacted while performing stirring for 12 hours. After performing filtration and pressure reduction on the reaction product to remove a solvent and by-products, 27 g of Sn[$N(CH_3)_2$]$_4$ was obtained at a yield of 80% by performing purification under conditions of a temperature of 50° C. and a pressure of 0.3 Torr.

Next, 27 g (0.091 mol) of Sn[$N(CH_3)_2$]$_4$ obtained above and 200 ml of diethyl ether were put into a 1,000 ml flask and mixed. After slowly adding 48.05 ml (0.096 mol) of t-butyl magnesium chloride in THF at about −70° C., the temperature was raised to room temperature, and the mixture was reacted while performing stirring for 8 hours. After performing filtration and pressure reduction on the reaction product to remove a solvent and by-products, 14 g of Sn(t-Bu) [$N(CH_3)_2$]$_3$ was obtained at a yield of 49% by performing purification under conditions of a temperature of 75° C. and a pressure of 0.2 Torr.

Experimental Example: Thermal Analysis

Thermogravimetric analysis (TGA) and differential scanning calorimetry (DSC) were performed in order to investigate the thermal stabilities and volatilization characteristics of the compounds according to Example 1 and Comparative Example 1 above respectively. First, thermogravimetric analysis was measured by putting a sample of a predetermined weight into a crucible, and then injecting argon gas at a pressure of 1.5 bar/min while raising the temperature from room temperature to 350° C. at a rate of 10° C./min. Differential scanning calorimetry was measured while raising the temperature of the sample to 400° C. at a rate of 10° C./min. The results according thereto are shown in FIGS. 2A, 2B, 3A and 3B.

Figure 2A:
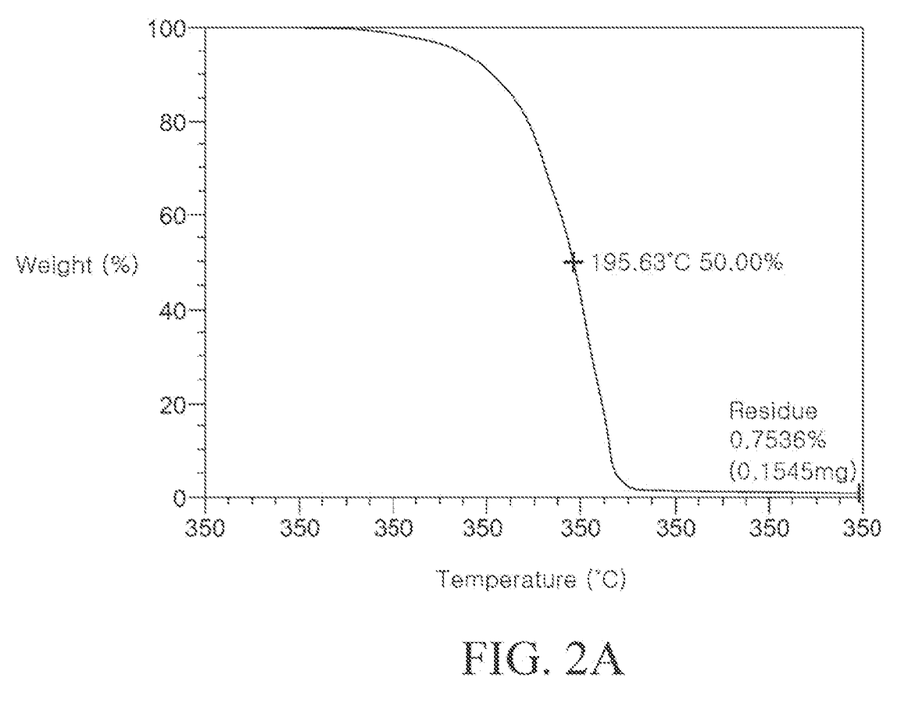
FIG. 2A is a graph showing the results of thermogravimetric analysis (TGA) of the compound according to Example 1.
Figure 2B:
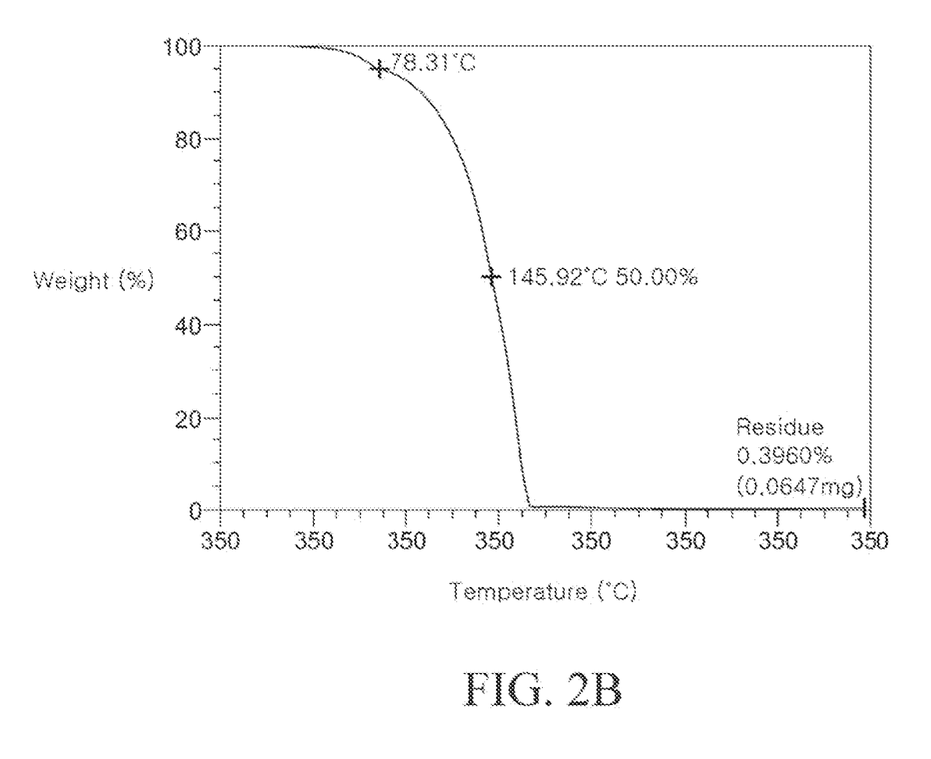
FIG. 2B is a graph showing the results of thermogravimetric analysis (TGA) of the compound according to Comparative Example 1.
Figure 3A:
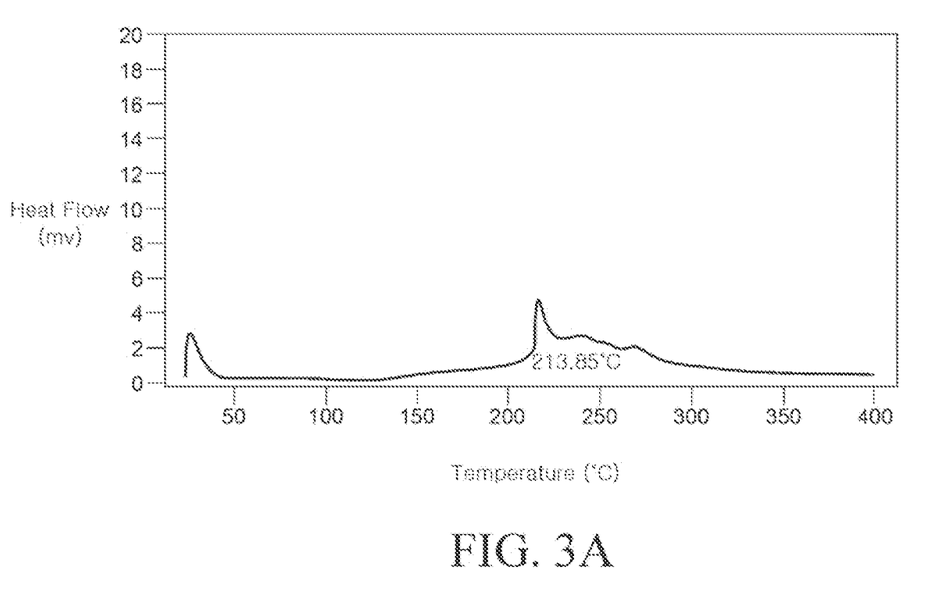
FIG. 3A is a graph showing the results of differential scanning calorimetry (DSC) of the compound according to Example 1.
Figure 3B:
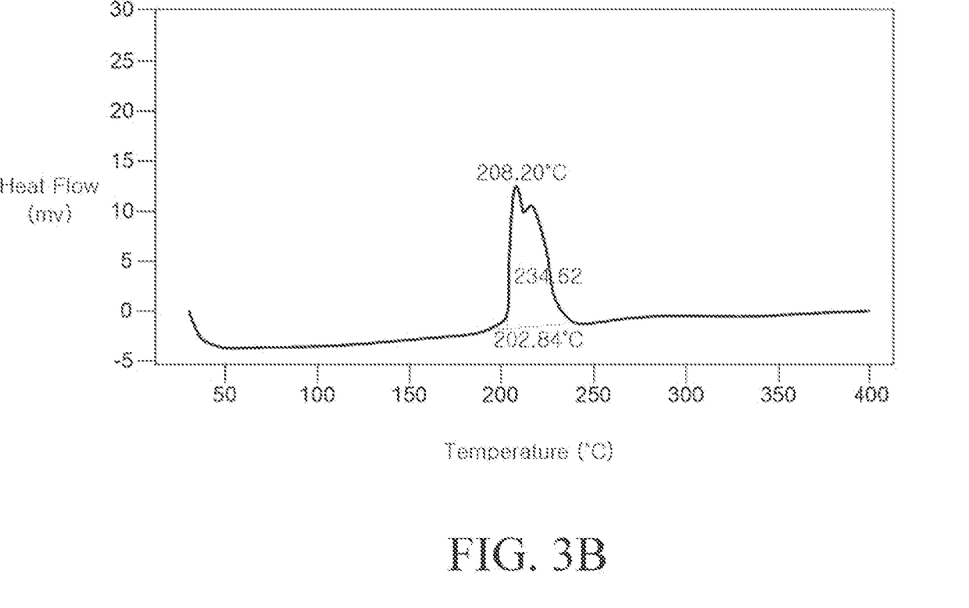
FIG. 3B is a graph showing the results of differential scanning calorimetry (DSC) of the compound according to Comparative Example 1.

FIG. 2A is a graph showing the results of thermogravimetric analysis (TGA) of the compound according to Example 1, FIG. 2B is a graph showing the results of thermogravimetric analysis (TGA) of the compound according to Comparative Example 1, FIG. 3A is a graph showing the results of differential scanning calorimetry (DSC) of the compound according to Example 1, and FIG. 3B is a graph showing the results of differential scanning calorimetry (DSC) of the compound according to Comparative Example 1.

First, referring to FIG. 2A, it can be confirmed that the mass decrease of the compound Sn(t-Bu) (Phenyl) [N(CH$_3$)$_2$]$_2$ of Example 1 occurs from about 100° C., and the residual amount thereof at 350° C. is 0.7%, and the half-life period (T$_{1/2}$) thereof is about 196° C. On the other hand, referring to FIG. 2B, it can be confirmed that the mass reduction of the compound Sn(t-Bu) [N(CH$_3$)$_2$]$_3$ of Comparative Example 1 occurs from 78° C., which is about 22° C. lower than that of Example 1, and the half-life period (T$_{1/2}$) thereof is about 146° C., which is 50° C. lower than that of Example 1.

Next, referring to FIG. 3A, it can be confirmed that thermal decomposition of the compound Sn(t-Bu) (phenyl) [N(CH$_3$)$_2$]$_2$ of Example 1 occurs at a temperature of about 210° C. or higher, and referring to FIG. 3B, it can be confirmed that thermal decomposition of the compound Sn(t-Bu) [N(CH$_3$)$_2$]$_3$ of Comparative Example 1 begins at about 200° C.

It can be seen from the above experimental results that the compound according to Example 1 is more thermally stable, has high volatility, and is more suitable as a precursor for forming a tin thin film through a deposition process.

Hereinafter, a method for forming a tin-containing thin film according to an embodiment of the present disclosure will be described.

In the method for forming a tin-containing thin film according to an embodiment of the present disclosure, the thin film is deposited on a substrate through a deposition process using the organo tin compound according to an embodiment of the present disclosure as a precursor.

The deposition process may consist of an atomic layer deposition (ALD) process or a chemical vapor deposition (CVD) process, for example, a metal organic chemical vapor deposition (MOCVD) process. The deposition process may be carried out at 50 to 700° C.

First, the organo tin compound represented by Chemical Formula 1 is transferred onto a substrate. For example, the organo tin compound may be supplied onto the substrate by a bubbling method, a vapor phase mass flow controller method, a direct gas injection (DGI) method, a direct liquid injection (DLI) method, a liquid transfer method in which the liquid is dissolved in an organic solvent and transferred, or the like, but is not limited thereto.

More specifically, the organo tin compound may be mixed with a carrier gas or dilution gas containing one or more selected from argon (Ar), nitrogen (N$_2$), helium (He), and hydrogen (H$_2$), and transferred onto the substrate by the bubbling method or the direct gas injection method.

Meanwhile, the deposition process may comprise a step of supplying one or more reactive gases selected from water vapor (H$_2$O), oxygen (O$_2$), ozone (O$_3$), and hydrogen peroxide (H$_2$O$_2$) when forming a tin oxide thin film. Further, the deposition process may comprise a step of supplying one or more reactive gases selected from ammonia (NH$_3$), hydrazine (N$_2$H$_4$), nitrous oxide (N$_2$O) and nitrogen (N$_2$) when forming a tin nitride thin film.

Although the present disclosure has been described in detail through Examples above, other types of Examples are also possible. Therefore, the technical spirit and scope of the claims set forth below are not limited to Examples.

What is claimed is:
1. An organo tin compound represented by the following Chemical Formula 2 or the following Chemical Formula 3:

[Chemical Formula 2]

[Chemical Formula 3]

2. The organo tin compound of claim 1, wherein the organo tin compound is a liquid at room temperature.

3. A precursor composition for depositing a tin-containing thin film, comprising the organo tin compound of claim 1.

4. A method for forming a tin-containing thin film, comprising depositing a thin film on a substrate through a metal organic chemical vapor deposition (MOCVD) process or an atomic layer deposition (ALD) process using the organo tin compound of claim 1 as a precursor.

5. The method of claim 4, wherein the deposition process is performed in a temperature range of 50 to 700° C.

6. The method of claim 4, wherein the deposition process comprises a step of moving the organo tin compound to the substrate through one selected from a bubbling method, a vapor phase mass flow controller (MFC) method, a direct gas injection (DGI) method, a direct liquid injection (DLI) method, and an organic solution supply method in which the organo tin compound is dissolved in an organic solvent and moved.

7. The method of claim 6, wherein the organo tin compound is moved together with a carrier gas onto the substrate by the bubbling method or the direct gas injection method, and the carrier gas is a mixture containing one or more selected from argon (Ar), nitrogen (N$_2$), helium (He), and hydrogen (H$_2$).

8. The method of claim 4, wherein the deposition process comprises a step of supplying one or more reactive gases selected from water vapor (H$_2$O), oxygen (O$_2$), ozone (O$_3$), and hydrogen peroxide (H$_2$O$_2$) when forming the tin-containing thin film.

9. The method of claim 4, wherein the deposition process comprises a step of supplying one or more reactive gases selected from ammonia ($NH_3$), hydrazine ($N_2H_4$), nitrous oxide ($N_2O$), and nitrogen ($N_2$) when forming the tin-containing thin film.

* * * * *